(12) United States Patent
Kiely et al.

(10) Patent No.: US 8,036,539 B2
(45) Date of Patent: Oct. 11, 2011

(54) GIGABIT ETHERNET LONGWAVE OPTICAL TRANSCEIVER MODULE HAVING AMPLIFIED BIAS CURRENT

(75) Inventors: Philip Kiely, Morgan Hill, CA (US); Minja Trklja, Mountain View, CA (US); Tim Moran, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 671 days.

(21) Appl. No.: 11/426,791

(22) Filed: Jun. 27, 2006

(65) Prior Publication Data

US 2006/0291786 A1    Dec. 28, 2006

Related U.S. Application Data

(60) Provisional application No. 60/694,624, filed on Jun. 28, 2005.

(51) Int. Cl.
   *H03F 3/04*    (2006.01)
   *H01S 3/00*    (2006.01)
   *H04B 10/04*   (2006.01)

(52) U.S. Cl. .................. 398/192; 372/38.01; 372/38.02; 372/33

(58) Field of Classification Search .................. 330/296; 372/29.015; 398/182
   See application file for complete search history.

(56) References Cited

U.S. PATENT DOCUMENTS

| | | | | |
|---|---|---|---|---|
| 4,112,387 A * | 9/1978 | Katakura et al. | ............... | 330/285 |
| 4,237,427 A * | 12/1980 | Holland | ............... | 372/29.02 |
| 4,347,610 A * | 8/1982 | Meuleman | ............... | 372/38.07 |
| 4,745,274 A * | 5/1988 | Muro | ............... | 250/214 R |
| 4,873,690 A * | 10/1989 | Adams | ............... | 372/8 |
| 4,995,100 A * | 2/1991 | Stallard et al. | ............... | 398/197 |
| 5,107,362 A * | 4/1992 | Motoshima et al. | ............... | 398/197 |
| 5,313,482 A * | 5/1994 | Zelenka et al. | ............... | 372/29.015 |
| 5,398,008 A * | 3/1995 | Nissler et al. | ............... | 332/178 |
| 5,444,728 A * | 8/1995 | Thompson | ............... | 372/38.02 |
| 5,448,629 A * | 9/1995 | Bosch et al. | ............... | 398/191 |
| 5,548,435 A * | 8/1996 | Tahara et al. | ............... | 398/195 |
| 5,579,328 A * | 11/1996 | Habel et al. | ............... | 372/31 |
| 5,598,040 A * | 1/1997 | Markis | ............... | 307/38 |
| 5,639,162 A * | 6/1997 | Sai | ............... | 374/161 |
| 5,802,089 A * | 9/1998 | Link | ............... | 372/38.02 |
| 5,883,910 A * | 3/1999 | Link | ............... | 372/38.07 |
| 5,936,986 A * | 8/1999 | Cantatore et al. | ............... | 372/38.02 |
| 5,949,566 A * | 9/1999 | Takano | ............... | 398/189 |
| 5,966,395 A * | 10/1999 | Ikeda | ............... | 372/38.01 |
| 6,069,802 A * | 5/2000 | Priegnitz | ............... | 363/21.06 |
| 6,111,901 A * | 8/2000 | Taguchi et al. | ............... | 372/38.02 |
| 6,166,839 A * | 12/2000 | Yamaguchi | ............... | 398/194 |
| 6,188,498 B1 * | 2/2001 | Link et al. | ............... | 398/195 |

(Continued)

*Primary Examiner* — Ken Vanderpuye
*Assistant Examiner* — Danny Leung
(74) *Attorney, Agent, or Firm* — Maschoff Gilmore & Israelsen

(57) ABSTRACT

An optical transceiver module configured for longwave optical transmission is disclosed. Significantly, the transceiver module utilizes components formerly used only for shortwave optical transmission, thereby reducing new component production and device complexity. In one embodiment, the transceiver module includes a transmitter optical subassembly including a laser capable of producing an optical signal. A consolidated laser driver/post amplifier including a first bias current source provides a bias current to the laser for producing the optical signal. A means for amplifying the bias current provided to the laser by the first bias current source is also included as a separate component from the laser driver/post amplifier. The means for amplifying in one embodiment is a field-effect transistor that is operably connected to the laser driver/post amplifier and configured to provide an additional bias current to the laser diode such that sufficient lasing operation of the laser is realized.

21 Claims, 4 Drawing Sheets

U.S. PATENT DOCUMENTS

| | | | |
|---|---|---|---|
| 6,192,060 B1 * | 2/2001 | Kobayashi | 372/38.01 |
| 6,195,370 B1 * | 2/2001 | Haneda et al. | 372/29.01 |
| 6,246,659 B1 * | 6/2001 | Suzuki et al. | 369/116 |
| 6,252,458 B1 * | 6/2001 | Shibata | 330/261 |
| 6,389,050 B2 * | 5/2002 | Stronczer | 372/38.02 |
| 6,466,595 B2 * | 10/2002 | Asano | 372/29.021 |
| 6,507,239 B2 * | 1/2003 | Ochi | 327/560 |
| 6,512,617 B1 * | 1/2003 | Tanji et al. | 398/137 |
| 6,554,492 B2 * | 4/2003 | Gilliland et al. | 385/88 |
| 6,559,995 B2 * | 5/2003 | Tokita | 398/182 |
| RE38,196 E * | 7/2003 | Vinciarelli et al. | 363/16 |
| 6,609,842 B1 * | 8/2003 | Kimbrough | 398/195 |
| 6,642,952 B2 * | 11/2003 | Furumiya et al. | 347/247 |
| 6,711,190 B2 * | 3/2004 | Schemmann et al. | 372/38.02 |
| 6,744,795 B2 * | 6/2004 | Magoon | 372/38.02 |
| 6,748,181 B2 * | 6/2004 | Miki et al. | 398/195 |
| 6,760,353 B2 * | 7/2004 | Wang | 372/38.02 |
| 6,788,147 B1 * | 9/2004 | Lubbers | 330/264 |
| 6,806,775 B2 * | 10/2004 | Abe | 330/297 |
| 6,819,876 B2 * | 11/2004 | Okayasu et al. | 398/182 |
| 6,822,987 B2 * | 11/2004 | Diaz et al. | 372/38.02 |
| 6,836,493 B2 * | 12/2004 | Mahowald et al. | 372/38.01 |
| 6,873,800 B1 * | 3/2005 | Wei et al. | 398/138 |
| 6,891,433 B2 * | 5/2005 | Schrader | 330/253 |
| 6,912,361 B2 * | 6/2005 | Aronson et al. | 398/135 |
| 6,941,080 B2 * | 9/2005 | Kasper et al. | 398/186 |
| 6,965,722 B1 * | 11/2005 | Nguyen | 385/147 |
| 6,973,107 B2 * | 12/2005 | Diaz et al. | 372/38.01 |
| 6,982,590 B2 * | 1/2006 | Seshita | 327/539 |
| 7,030,688 B2 * | 4/2006 | Dosho et al. | 327/558 |
| 7,133,429 B2 * | 11/2006 | Moran | 372/38.02 |
| 7,154,921 B2 * | 12/2006 | Kitamura et al. | 372/26 |
| 7,155,133 B2 * | 12/2006 | Stewart et al. | 398/202 |
| 7,162,160 B2 * | 1/2007 | Aronson et al. | 398/137 |
| 7,164,700 B2 * | 1/2007 | Koda | 372/38.02 |
| 7,174,106 B2 * | 2/2007 | Weber | 398/135 |
| 7,180,921 B2 * | 2/2007 | Mangano et al. | 372/38.02 |
| 7,181,100 B2 * | 2/2007 | Douma | 385/14 |
| 7,184,452 B2 * | 2/2007 | Moran | 372/38.02 |
| 7,187,227 B2 * | 3/2007 | Umeda et al. | 327/399 |
| 7,193,480 B2 * | 3/2007 | Ishida et al. | 331/57 |
| 7,217,914 B2 * | 5/2007 | Stewart et al. | 250/214 R |
| 7,236,506 B2 * | 6/2007 | Seo et al. | 372/26 |
| 7,269,192 B2 * | 9/2007 | Hayashi | 372/34 |
| 7,280,574 B1 * | 10/2007 | Khawshe et al. | 372/38.02 |
| 7,292,612 B2 * | 11/2007 | Ono | 372/38.02 |
| RE40,249 E * | 4/2008 | Cannata et al. | 250/332 |
| 7,356,058 B2 * | 4/2008 | Koren et al. | 372/38.01 |
| 7,437,078 B2 * | 10/2008 | Hofmeister et al. | 398/128 |
| 7,459,982 B2 * | 12/2008 | Miao | 330/308 |
| 7,532,653 B2 * | 5/2009 | Anderson et al. | 372/38.07 |
| 7,570,680 B2 * | 8/2009 | Nishiyama | 372/38.02 |
| 2001/0026566 A1 * | 10/2001 | Taguchi et al. | 372/38.02 |
| 2001/0028665 A1 * | 10/2001 | Stronczer | 372/38.02 |
| 2001/0048796 A1 * | 12/2001 | Otsuka | 372/31 |
| 2002/0064193 A1 * | 5/2002 | Diaz et al. | 372/26 |
| 2002/0101266 A1 * | 8/2002 | Warwar | 327/108 |
| 2002/0149821 A1 * | 10/2002 | Aronson et al. | 359/152 |
| 2002/0167980 A1 * | 11/2002 | Verboom et al. | 372/38.08 |
| 2003/0030873 A1 * | 2/2003 | Hietala et al. | 359/181 |
| 2003/0086455 A1 * | 5/2003 | Ciubotaru et al. | 372/38.02 |
| 2003/0174747 A1 * | 9/2003 | Wyman et al. | 372/38.01 |
| 2003/0210917 A1 * | 11/2003 | Stewart et al. | 398/209 |
| 2004/0008745 A1 * | 1/2004 | Magoon | 372/38.02 |
| 2004/0022284 A1 * | 2/2004 | Wang | 372/38.02 |
| 2004/0086006 A1 * | 5/2004 | Tanikoshi | 372/29.02 |
| 2004/0125837 A1 * | 7/2004 | Tatehara et al. | 372/38.02 |
| 2004/0141760 A1 * | 7/2004 | Wynne Willson | 398/197 |
| 2004/0233949 A1 * | 11/2004 | Wang | 372/38.02 |
| 2004/0240886 A1 * | 12/2004 | Aronson et al. | 398/135 |
| 2004/0253003 A1 * | 12/2004 | Farmer et al. | 398/214 |
| 2005/0001152 A1 * | 1/2005 | Stewart et al. | 250/214 R |
| 2005/0041707 A1 * | 2/2005 | Mangano et al. | 372/38.02 |
| 2005/0058455 A1 * | 3/2005 | Aronson et al. | 398/135 |
| 2005/0105574 A1 * | 5/2005 | Wu et al. | 372/38.07 |
| 2005/0135444 A1 * | 6/2005 | Krishnaswami et al. | 372/38.02 |
| 2005/0195872 A1 * | 9/2005 | Moran | 372/38.07 |
| 2006/0044072 A1 * | 3/2006 | Kucharski | 332/149 |
| 2006/0045531 A1 * | 3/2006 | Killmeyer et al. | 398/135 |
| 2006/0098699 A1 * | 5/2006 | Sanchez | 372/26 |
| 2006/0126683 A1 * | 6/2006 | Kang et al. | 372/38.02 |
| 2006/0140233 A1 * | 6/2006 | Chin et al. | 372/38.02 |
| 2006/0153256 A1 * | 7/2006 | Sanchez | 372/34 |
| 2006/0165139 A1 * | 7/2006 | Sanchez | 372/29.021 |
| 2006/0182449 A1 * | 8/2006 | Iannelli et al. | 398/186 |
| 2006/0189511 A1 * | 8/2006 | Koblish et al. | 514/2 |
| 2006/0291786 A1 * | 12/2006 | Kiely et al. | 385/92 |
| 2007/0153849 A1 * | 7/2007 | Koren et al. | 372/38.02 |
| 2007/0159773 A1 * | 7/2007 | Deng et al. | 361/600 |
| 2007/0237195 A1 * | 10/2007 | Sekigawa | 372/29.011 |
| 2007/0280315 A1 * | 12/2007 | Mizuno | 372/38.02 |
| 2008/0002747 A1 * | 1/2008 | Ono | 372/38.02 |
| 2008/0074196 A1 * | 3/2008 | Miao | 330/308 |
| 2009/0033426 A1 * | 2/2009 | Miao | 330/302 |
| 2009/0041071 A1 * | 2/2009 | Irie | 372/29.015 |
| 2009/0190621 A1 * | 7/2009 | Anderson et al. | 372/38.03 |

\* cited by examiner

GIGABIT ETHERNET LONGWAVE OPTICAL TRANSCEIVER MODULE HAVING AMPLIFIED BIAS CURRENT

CROSS-REFERENCE TO RELATED APPLICATIONS

This application claims the benefit of U.S. Provisional Patent Application No. 60/694,624, filed Jun. 28, 2005, and entitled "Gigabit Ethernet Longwave Optical Transceiver Module," which is incorporated herein by reference in its entirety.

BACKGROUND

1. Technology Field

The present invention generally relates to optical transceiver modules. More particularly, the present invention relates to a low-cost optical transceiver module having simplified construction and electronic scheme for longwave optical signal transmission.

2. The Related Art

Optical transceivers are used to transmit and receive optical signals from an optical network and to enable electrical network components to interface with and communicate over optical networks. Many optical transceivers are modular and are designed in accordance with industry standards that define mechanical aspects of the transceivers, form factors, optical and electrical requirements, and other characteristics and requirements of the transceivers. For example the Small Form-Factor Module Multi-Source Agreement ("SFF MSA"), the Small Form-Factor Pluggable Module Multi-Source Agreement ("SFP MSA") and the 10 Gigabit Small Form Factor Pluggable Module Multi-Source Agreement ("XFP MSA") Revision 3.1 define such standards.

The basic optical components of conventional transceivers include a transmitter optical sub-assembly ("TOSA") and a receiver optical sub-assembly ("ROSA"). The TOSA receives electrical signals from a host device via circuitry of the transceiver module and generates a corresponding optical signal that is then transmitted to a remote node in an optical network. Conversely, the ROSA receives an incoming optical signal and outputs a corresponding electrical signal that can then be used or processed by the host device. Additionally, most transceivers include a rigid printed circuit board (PCB) containing, among other things, control circuitry for the TOSA and ROSA. Such control circuitry can include laser drivers and post amplifiers for conditioning the data signals handled by the TOSA and ROSA, respectively.

The TOSA and ROSA are each connected to the optical network via optical fibers that are capable of transmitting optical signals. Each optical fiber includes a connector that mates with a corresponding port defined in the respective TOSA or ROSA.

The TOSA includes a light source, such as a laser diode, that produces the optical signal transmitted via the optical fibers connected to the TOSA. The laser can be configured to transmit optical signals at one or more wavelengths. For instance, transceivers are often categorized as either "shortwave" ("SW") or "longwave" ("LW") transceivers, depending on the predominant wavelength emitted and/or received thereby. Examples of shortwave optical signal wavelengths transmitted by a transceiver are 780 or 850 nm; longwave transceivers can transmit optical signals having 1310 or 1550 nm wavelengths, for instance.

As the rates at which data is transmitted via communications networks rises and the cost of optical communication networks tightens, there exists an ever-increasing need to reduce costs involved in producing optical devices. One way this can be achieved is by increasing the interchangeability of components used to form optical devices, such as optical transceiver modules.

In particular, the ability to utilize common components, such as laser drivers and post amplifiers, in both longwave and shortwave transceivers represents a potentially significant savings that may be realized. Unfortunately, differences between longwave and shortwave transceiver designs often make interchangeability difficult, especially with regard to laser drivers, which often have distinct current and impedance requirements, depending on the wavelength of the optical signal to be transmitted.

As such, a need exists in the art by which optical devices, such as optical transceiver modules, can be configured such that selected components can be interchanged among different device types. In particular, it would be useful to provide the ability to utilize selected internal components, such as shortwave laser drivers, in longwave transceivers with a minimum of modification, thereby providing the ability to produce a low-cost longwave transceiver with minimum complexity.

BRIEF SUMMARY

The present invention has been developed in response to the above and other needs in the art. Briefly summarized, embodiments of the present invention are directed to an optical transceiver module that is configured for longwave optical transmission. Significantly, the transceiver module utilizes components formerly used only for shortwave optical transmission, thereby reducing new component production and device complexity.

In one embodiment, the transceiver module includes a transmitter optical subassembly including a laser capable of producing an optical signal. A consolidated laser driver/post amplifier including a first bias current source provides a bias current to the laser for producing the optical signal. A means for amplifying the bias current provided to the laser by the first bias current source is also included as a separate component from the laser driver/post amplifier.

The means for amplifying in one embodiment is a field-effect transistor that is operably connected to the laser driver/post amplifier and configured to provide an additional bias current to the laser diode such that sufficient lasing operation of the laser is realized. In another embodiment the means for amplifying is configured as a bi-polar transistor. In yet another embodiment, a buffer amplifier can be placed between the laser driver/post amplifier and the means for amplifying to further assist in producing an acceptable bias current for the laser.

Embodiments of the present invention are configured for operation in a longwave, SFP-type optical transceiver module having a data rate of at least 1 Gigabit/second. It is appreciated, however, that transceiver modules having a variety of configurations and speeds can also acceptably employ the principles of the various embodiments described herein. In particular, it is appreciated that the optical transceiver module described herein is a low-cost module, utilizing a laser driver/post amplifier originally configured for shortwave transceiver designs. However, by virtue of the use of an additional bias current source as will be described herein, the shortwave laser driver/post amplifier can be used for longwave transmissions within the present transceiver module, thus increasing interchangeability while reducing complexity and the need for additional component design.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SELECTED EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-6 depict various features of embodiments of the present invention, which is generally directed to an optical transceiver module configured for Gigabit (i.e., 1 Gigabit/second) longwave optical communication. The present transceiver is further configured so as to be implemented with a simple design that affords manufacturability at a reduced cost over other similarly able longwave transceivers.

Figure 1:
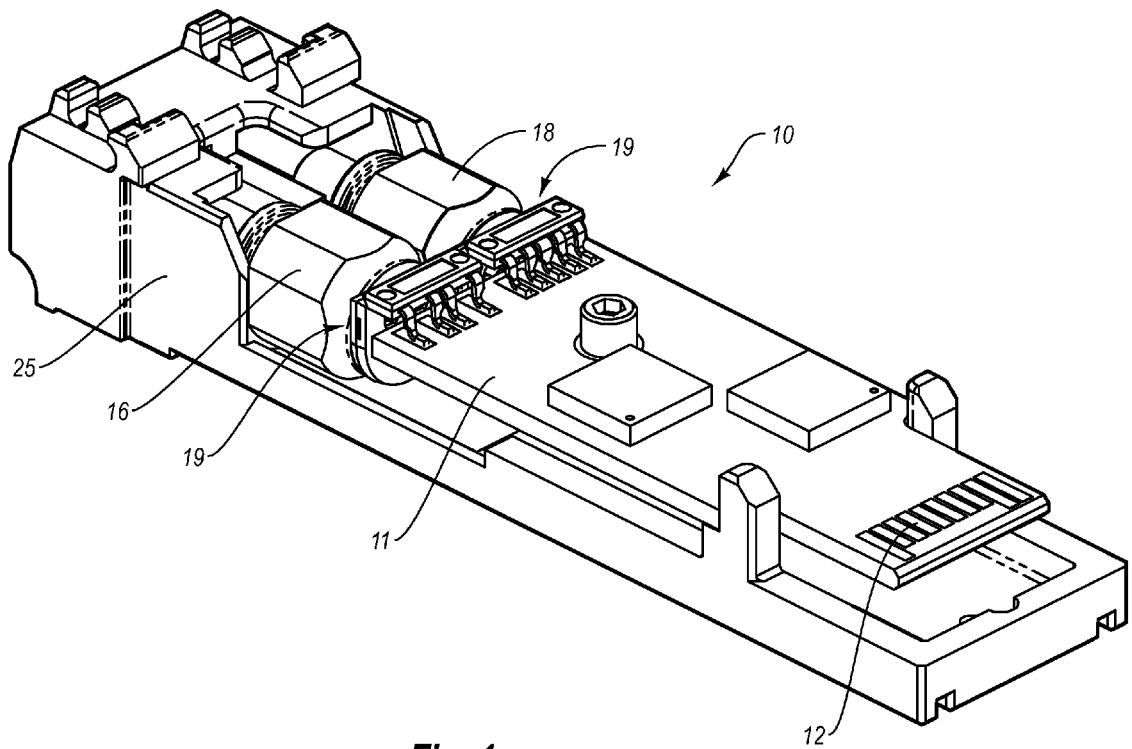
FIG. 1 is a perspective view of an optical transceiver module including an embodiment of the present invention.
Figure 2:
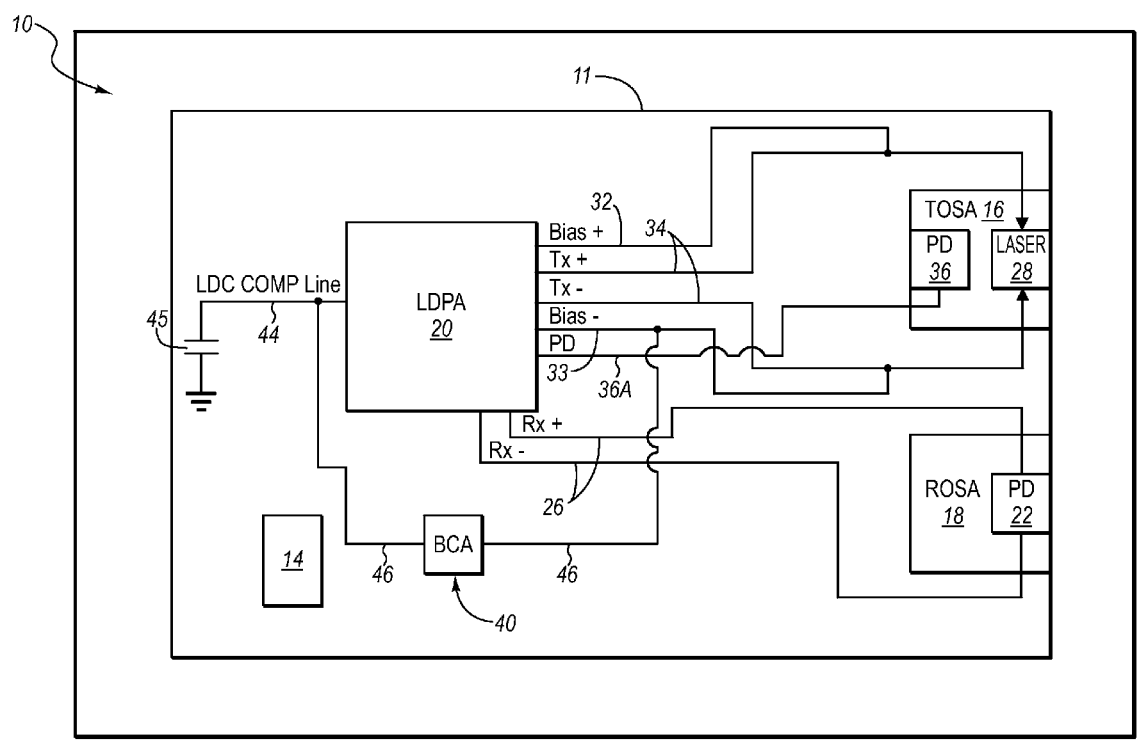
FIG. 2 is a simplified block diagram of the transceiver of FIG. 1, illustrating various aspects of the present invention, according to one embodiment.

Reference is first made to FIGS. 1 and 2, which schematically depict various details of an optical transceiver module ("transceiver"), generally designated at 10, according to one embodiment. The transceiver 10 is configured for use in transmitting and receiving optical signals in connection with an external host (not shown) that is operatively connected in one embodiment to a communications network (also not shown). As depicted, the transceiver 10 shown in FIG. 1 contains various components positioned on or in relation to a printed circuit board ("PCB") 11, including a connector 12 for enabling the transceiver to communicatively interface with the host. The connector 12 in the present embodiment is of a type "small form pluggable" ("SFP") and is disposed on an edge of the PCB 11, though other connector types can alternatively be employed. Persistent memory 14 is included on the PCB 11 to store pertinent data, such as identification and initial settings information for the transceiver 10.

The transceiver 10 further includes a transmitter optical subassembly ("TOSA") 16 and receiver optical subassembly ("ROSA") 18 that collectively enable transmission and reception by the transceiver of data-containing optical signals via optical fibers (not shown) that connect with the TOSA and ROSA. In turn, the TOSA 16 and ROSA 18 are each operably connected to the PCB 11 by an electrical interface 19. As such, the PCB 11 facilitates electrical communication between each of the TOSA 16, TOSA 18 and the host. The above-mentioned transceiver components are partially housed in a shell 25 that can cooperate with a cover (not shown) to define a housing for the transceiver 10.

Note that embodiments of the present invention are directed to a transceiver configured with a simple design to enable longwave optical transmission and reception while minimizing transceiver assembly cost. Note that, while it will be discussed in some detail, the optical transceiver 10 is described by way of illustration only, and not by way of restricting the scope of the invention. As mentioned above, the transceiver 10 in one embodiment is suitable for optical signal transmission and reception at per-second data rates of at least 1 Gbit, though data rates are also possible in other embodiments. Furthermore, principles of the present invention can be implemented in optical transceivers of any form factor such as XFP, SFP and SFF, without restriction, and with one or more of various optical wavelengths, both in the longwave and shortwave emission ranges.

During operation, the transceiver 10 can receive a data-carrying electrical signal from the host, which can be any computing system capable of communicating with the transceiver 10, for transmission as a data-carrying optical signal on to an optical fiber (not Shown). This electrical data signal that is supplied to the transceiver 10 is carried via a pair of differential transmit signal lines 34, shown in FIG. 2. Each signal line of the differential signal line pair carries one of two streams of differential electrical data that differ from each other only in signal polarity. As such, the lines are respectively indicated with "Tx" and a "+" or a "−" indicator, indicating the respective positive or negative polarity of each transmit line. The electrical differential data signal is provided to a light source, such as a laser 28 located in the TOSA 16, which converts the electrical signal into a data-carrying optical signal for emission on to an optical fiber and transmission via an optical communications network, for instance. The laser 28 can be an edge-emitting laser diode (e.g., Fabry-Perot, DFB, etc.), a vertical cavity surface emitting laser ("VCSEL"), or other suitable light source. Accordingly, the TOSA 16 serves as an electro-optic transducer.

Two differential laser bias signal lines 32 and 33 are also included and associated with the differential transmit signal lines 34 to provide a bias current to the laser 28 to enable its operation. These are identified by "Bias +" (line 32) and "Bias −" (line 33) to respectively indicate their polarity relationship to the transmit signal lines 34. Also, the TOSA 16 includes a photodetector ("PD") 36 that is used to monitor the power of the optical signal emitted by the laser 28. A "PD" signal line 36A is operably connected with the PD 36.

In addition, the transceiver 10 is configured to receive a data-carrying optical signal from an optical fiber via the ROSA 18. The ROSA 18 acts as an opto-electric transducer by transforming the received optical signal, via a photodiode ("PD") 22 or other suitable device, into an electrical signal. The resulting electrical signal is carried via a pair of differential receive signal lines 26. As is the case with the differential transmit signal lines 34, each signal line of the differential receive signal lines 26 carries one of two streams of differential electrical data that differ from each other only in signal polarity. As such, the lines are respectively denoted with a "Rx" and a "+" or a "−" designation, indicating the respective positive or negative polarity of each line.

Electronic componentry is included on the PCB 11 of the transceiver 10 to assist in data signal transmission and reception. In the illustrated embodiment, a post amplifier for conditioning the electrical signal received from the photodiode 22 is consolidated with a laser driver for driving the laser 28 to form an integrated laser driver/post amplifier ("LDPA") 20. As such, the LDPA 20 resides on a single integrated circuit chip and is included as a component, together with the other electronic components shown in FIG. 2 on the PCB 11. Further details regarding the integrated LDPA 20 can be found in U.S. patent application Ser. No. 10/970,529, entitled "Integrated Post Amplifier, Laser Driver, and Controller," filed Oct. 21, 2004 (the "'529 Application"), which is incorporated herein by reference in its entirety. In other embodiments, the post amplifier and laser driver can be included as separate components on the PCB 11.

In greater detail, the LDPA 20 assists, in the case of the TOSA 16, in conditioning the electrical data signal received from the host before forwarding the signal to the TOSA for conversion into an optical signal by the laser 28. As just alluded to, the laser 28 is driven both by a signal current ("bias current") provided by the bias signal lines 32 and by an additional modulation signal current provided by the transmit signal lines 34. In one embodiment, the LDPA 20 is implemented as an integrated circuit on the PCB and includes various pins that interconnect with the various signal lines shown in FIG. 2. In other embodiments, the LDPA can take other forms or have other interconnection configurations.

The transceiver 10 of the present embodiment further includes means for amplifying the bias current provided to the laser 28 by the LDPA 20 via the laser bias signal lines 32 and 33. In one implementation, this means can be provided by one or more electronic components configured in relation to the LDPA 20 for bias current amplification. In particular, the illustrated embodiment depicts a means for amplifying the laser bias current that includes a bias current amplifier ("BCA") 40 that is arranged to cooperate with the LDPA 20 in providing a sufficient amount of bias current to the laser 28 during transceiver operation. As such, the BCA 40 acts as an additional source, with the LDPA 20, for providing bias current to the laser 28 during operation. Though shown in FIG. 2 as being mounted on the PCB 1, in other embodiments the BCA 40 can be included atop other transceiver components or in another location within the transceiver 10.

Specifically, FIG. 2 shows that in the present embodiment the BCA 40 is operably connected both with a signal line of the LDPA 20, namely, an LDCCOMP line 44 and the negative polarity (−) laser bias signal line 33, via respective connection lines 46. As mentioned, the LDCCOMP line 44, the laser bias signal line 33, and other lines in FIG. 2 are implemented in one embodiment as conductive traces on the PCB 11 and operably connect with respective pins included on the LDPA 20.

In greater detail, the negative polarity laser bias signal line 33 is an output line from the LDPA 20 that cooperates with the positive polarity laser bias signal line 32 in providing the bias current, produced by internal circuitry of the LDPA 20, to the laser 28. In effect, the BCA 40 is placed in parallel with the laser bias signal line 33 to amplify the laser bias output to the laser 28. The LDCCOMP line 44 is also an output line from the LDPA 20 and is used, together with its connection to a capacitor 45, as a bias loop filter for voltage biasing of internal circuitry of the LDPA 20, which internal circuitry in turn produces the LDPA-provided, or "internal," portion of the bias current for the laser 28. In addition to this more traditional role, the LDCCOMP line 44 is also used in the present embodiment to control the BCA 40 as an external control source. In this configuration, then, the BCA 40 can augment laser bias current provided to the laser 28 by internal LDPA bias circuitry while still being controlled by the LDPA internal bias loop control circuitry. So configured, the BCA 40 can be thought of as being in parallel with the internal bias current source of the LDPA 20, while both of these parallel current sources are controlled by the bias loop control functionality of the LDCCOMP line 44.

Note that, while it is shown and described above as being operably connected with the negative polarity laser bias signal line 33, the BCA can alternatively be attached to the positive polarity laser bias signal line 32 shown in FIG. 2 in order to provide an additional bias current to the laser.

As mentioned, inclusion of the BCA 40 in the transceiver 10 enables the creation of a boost in laser bias current over what would be typically achievable by the LDPA 20 alone. This is so because the components shown in FIGS. 1 and 2 of which the transceiver 10 is composed, with the exception of the BCA 40 and associated connection lines 46, are typically configured for operation in transmitting and receiving shortwave optical signals, not longwave signals per embodiments of the present invention. Use of such a shortwave-related component configuration is advantageous for longwave optical signal transmission and reception in that it minimizes manufacturing costs by enabling one prevalent design to be employed for transceivers of shortwave operation and transceivers of longwave operation. As such, inclusion of the BCA 40 in a low-cost transceiver design originally designed for shortwave communication enables longwave optical transmission and reception capabilities while minimizing manufacturing costs. In addition, component interchangeability and device flexibility is increased, as may be appreciated.

Figure 3:
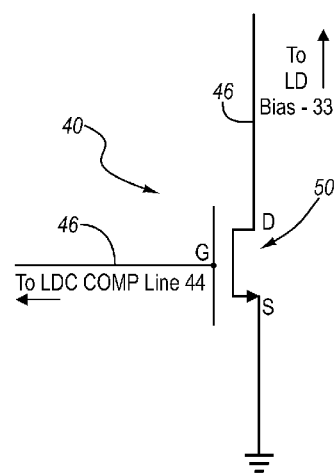
FIG. 3 is a schematic view of a bias current amplifier for a light source included in the optical transceiver module of FIG. 1, in accordance with one embodiment.

Reference is now made to FIG. 3, which depicts various details of the BCA 40 configured according to one embodiment. As shown in FIG. 3, in one embodiment the BCA 40 can include a field-effect transistor ("FET") 50 having a corresponding source ("S"), gate ("G"), and drain ("D"), as indicated. In the present embodiment, the drain of the FET 50 is operably connected to the negative polarity laser bias signal line 33 via one of the connection lines 46, while the gate is operably connected to the LDCCOMP line 44 via another connection line 46. The FET source is connected to ground. In this configuration, the FET 50 serves as a voltage-controlled current source. Note that, while one type of field-effect transistor is shown in FIG. 3, other field-effect transistor types can also be employed as the BCA 40 in providing a voltage-controlled current source for the laser 28, in addition to the internal bias current provided by the LDPA 20, as noted above.

A transceiver similar to the transceiver 10 shown in FIGS. 1 and 2 but without the FET 50 typically produces approximately 16 milliamperes ("mA") of laser bias current and approximately 16 mA modulation current for shortwave applications, the laser bias current being provided by the LDPA 20. For longwave applications (e.g., 1310 nanometers), the same transceiver can produce approximately 30 mA laser bias and about 30 mA modulation current given the lower impedance typical for longwave edge-emitting lasers. Inclusion of the FET 50 or other suitable BCA 40 in the transceiver, as in FIG. 2, for longwave applications boosts the laser bias current to approximately 60 mA, which, together with the 30 mA modulation current, is sufficient for longwave optical transmission rates of 1 Gbit/sec. Ethernet up to approximately 2 Gbit/sec.

This higher bias requirement for a longwave edge-emitting laser is largely rooted in the higher threshold currents typical for these devices when compared with shortwave, vertical cavity lasers. As an example, a typical 1310 nm Fabry-Perot type laser may have a threshold current of 25 mA at 85 C. To maintain a 1 Gb/s signal at 85 C, a modulation current of ~20 mA may be required. When using an AC coupled system, this leads to a bias current at beginning of life of 25+(20/2), or 35 mA. For edge emitter lasers, lifetime is usually defined as an increase in operating current (or bias) of 50%, hence the bias circuitry needs to be capable of providing 52.5 mA.

Note that the transceiver 10 of FIG. 1 does not include a processor-based controller for diagnostic and other functions in order to reduce manufacturing costs. If desired, however, such a controller can be employed in the present transceiver. Also, in one embodiment the LDPA 20 can include circuitry configured to regulate the signals carried to the BCA 40 indirectly via the LDCCOMP line 44 so as to control the amount of additional bias current to be provided to the laser 28.

Figure 4:
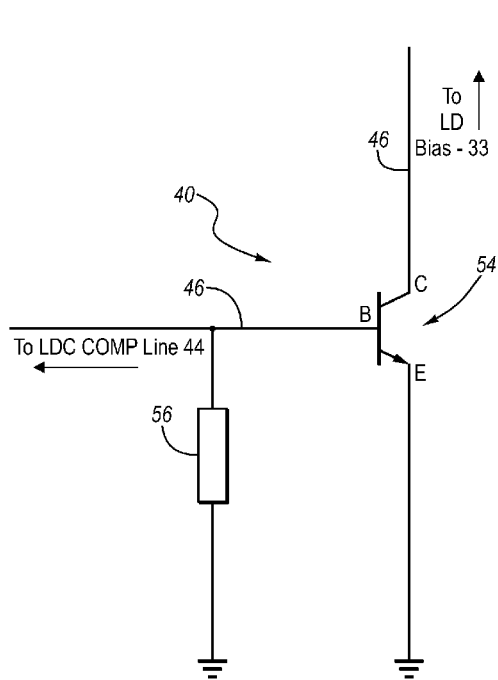
FIG. 4 is a schematic view of a bias current amplifier for a light source included in the optical transceiver module of FIG. 1, according to another embodiment.

Reference is now made to FIG. 4, which depicts another example of the BCA 40 as a means for amplifying laser bias current, according to one embodiment. In this embodiment the BCA 40 as a means for amplifying includes a bipolar transistor 54 and a resistor 56 operably attached as shown in FIG. 2. The bi-polar transistor 54 includes a base ("B") collector ("C"), and emitter ("E"), as indicated. The collector of the bi-polar transistor 54 is operably connected to the negative polarity laser bias signal line 33 via one of the connection lines 46, while the base is operably connected to the LDCCOMP line 44 via another connection line 46. The emitter is connected to ground. In addition, the resistor 56 is operably connected to the connection line 46 that extends between the LDCCOMP line 44 and the base of the bi-polar transistor 54. Note that, while one bi-polar transistor is shown in FIG. 3, other bi-polar transistor types can also be employed in providing a current-controlled current source as the BCA 40.

The bi-polar transistor arrangement as the BCA 40 of FIG. 2 is, like the FET 50, configured to provide bias current to the laser 28 of the TOSA 16 in addition to that provided by the LDPA 20. In particular, the resistor 52 is positioned so as to produce a current from the voltage provided by the LDCCOMP line 44, which current is then received by the bipolar transistor 50 and used to yield an amplified current forwarded via the connection line 46/laser bias signal line 33 for use by the laser 28. In this way, the bipolar transistor functions as a current-controlled current device in providing additional bias current to the laser 28. This is in contrast to the FET 40 of FIG. 1, which is a voltage-controlled current source.

Figure 5:
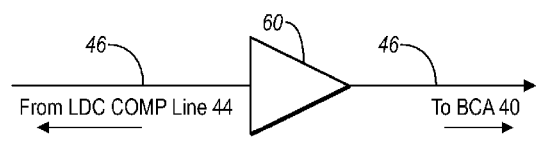
FIG. 5 is a schematic view of an amplifier for use in conjunction with a bias current amplifier of embodiments of the present invention.

Reference is now made to FIG. 5. In one embodiment, a buffer amplifier 60 is positioned along the connection line 46 between the LDCCOMP output of the LDPA 20 and the BCA 40 serving as a means for amplifying. So positioned, the buffer amplifier 60 serves to modify as necessary the voltage level from the LDCCOMP LDPA output to a level or signal type needed to sufficiently drive the FET, bi-polar transistor, or other suitable BCA. Note that the buffer amplifier 60 can be either a current amplifier or voltage amplifier, depending on the particular configuration of the BCA 40. The amplifier 60 further enables the BCA 40 to be positioned on the "high side" of the laser 28. The buffer amplifier may be any suitable voltage amplifier commonly used in IC circuits.

Figure 6:
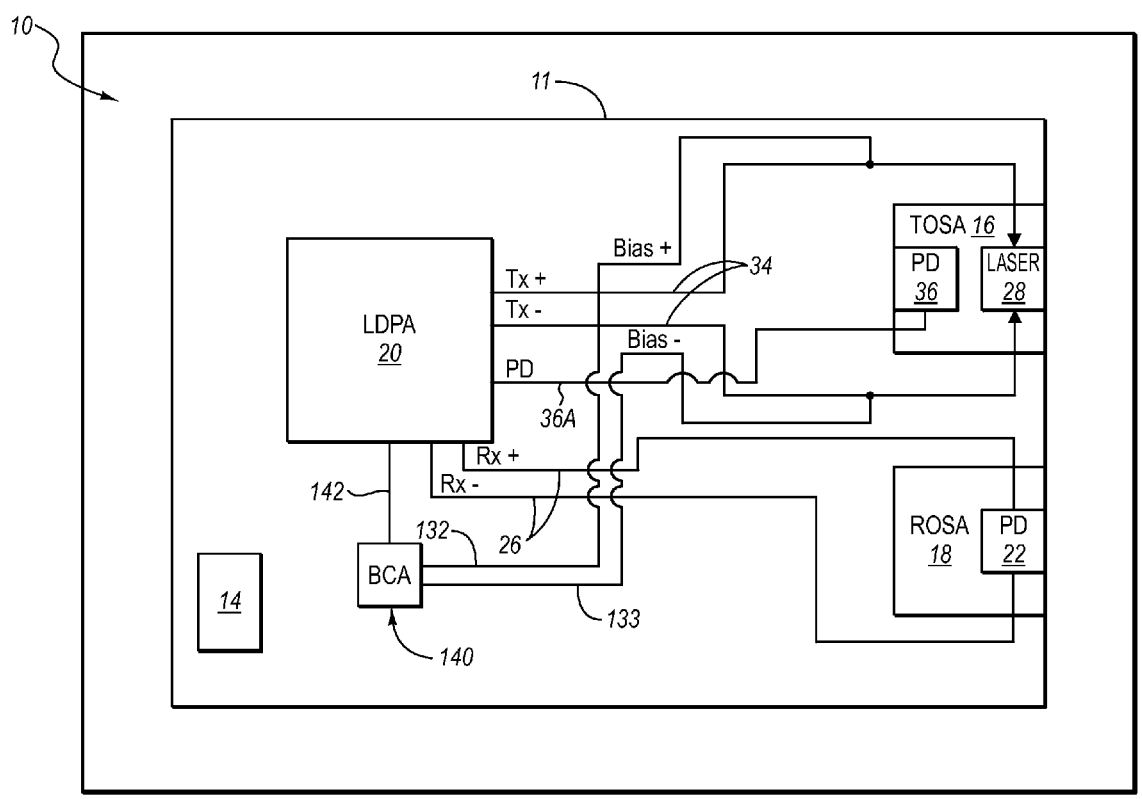
FIG. 6 is a simplified block diagram of the transceiver of FIG. 1, illustrating a various aspects of the present invention, according to another embodiment.

Reference is now made to FIG. 6. In one alternative embodiment, the BCA can serve as the sole source for bias current for the laser. FIG. 6 shows such a configuration, wherein a BCA 140 is shown disposed on the PCB 11 of the transceiver 10. The LDPA 20 includes no internal circuitry for producing a laser bias current, and as such includes no laser bias current signal lines. Instead, the BCA 140 is configured to produce a laser bias over both a positive polarity laser bias current signal line 132 and negative polarity laser bias current signal line 133, which are each operably connected to the laser 28. In this configuration, the entirety of the bias current for the laser 28 is produced by the BCA, which can be composed of one or more transistors, such as FETS. Operation of the BCA 140 can still be controlled by the LDPA 20, if desired, via a control line 142. Note that the BCA described here can provide bias current to only a single signal line, if desired. Also, in yet other embodiments a proportional amount of laser bias current from the LDPA and the BCA can be selectively designated via user or automatic input for provision to the laser.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An optical transceiver module, comprising:
   a transmitter optical subassembly including a laser capable of producing an optical signal;
   a laser driver including a first bias current source that provides a bias current to the laser and a modulation current source that provides a modulation current to the laser, the bias and modulation currents for producing the optical signal; and
   means, separate from the laser driver, for amplifying substantially only the bias current provided to the laser by the first bias current source,
   wherein:
      the first bias current source and the means, separate from the laser driver, for amplifying substantially only the bias current are at least partially controlled by the same control line,
      the laser is configured for longwave optical transmission,
      the laser driver is configured for longwave optical transmission in the optical transceiver module and may be configured for shortwave optical transmission in a different optical transceiver module by omitting the means, separate from the laser driver, for amplifying substantially only the bias current,
      the means, separate from the laser driver, for amplifying substantially only the bias current operably connects with an LDBIAS pin and an LDCCOMP pin of the laser driver.

2. The optical transceiver module as defined in claim 1, wherein the means, separate from the laser driver, for amplifying substantially only the bias current is connected in parallel to the first bias current source.

3. The optical transceiver module as defined in claim 1, wherein the means, separate from the laser driver, for amplifying substantially only the bias current is connected across two pins of the laser driver.

4. The optical transceiver module as defined in claim 1, wherein the means, separate from the laser driver, for amplifying substantially only the bias current is a second bias current source disposed externally to the laser driver.

5. The optical transceiver module as defined in claim 1, wherein the means, separate from the laser driver, for amplifying substantially only the bias current is positioned on a printed circuit board.

6. The optical transceiver module as defined in claim 1, wherein the means, separate from the laser driver, for amplifying substantially only the bias current is an integrated circuit.

7. The optical transceiver module as defined in claim 1, wherein the means, separate from the laser driver, for amplifying substantially only the bias current is a voltage-controlled current source.

8. The optical transceiver module of claim 1, wherein the means, separate from the laser driver, for amplifying substantially only the bias current includes:
a resistor comprising:
a first end connected to the LDCCOMP pin of the laser driver; and
a second end connected to ground; and
a bi-polar transistor comprising:
a collector portion operably connected to the LDBIAS pin of the laser driver;
a base portion operably connected to the first end of the resistor and the LDCCOMP pin of the laser driver; and
an emitter portion operably connected to ground.

9. The optical transceiver module of claim 1, further comprising a buffer amplifier coupled between the LDCCOMP pin of the laser driver and the means, separate from the laser driver, for amplifying substantially only the bias current.

10. An optical transmitter, comprising:
a light source;
a driver including internal circuitry that provides a first bias current and a modulation current to the light source; and
a bias current amplifier that amplifies substantially only the first bias current provided to the light source,
wherein:
the bias current amplifier is operably connected to and controlled by the driver via a single control line,
the light source is a laser configured for longwave optical transmission,
the laser driver is a laser driver configured for longwave optical transmission in the optical transmitter and may be configured for shortwave optical transmission in a different optical transmitter by omitting the bias current amplifier that amplifies substantially only the first bias current provided to the light source,
the bias current amplifier operably connects with an LDBIAS pin and an LDCCOMP pin of the laser driver.

11. The optical transmitter as defined in claim 10, wherein the first bias current is amplified by a second bias current that is produced external to the driver.

12. The optical transmitter as defined in claim 11, wherein the first and second bias currents are combined before being received by the light source.

13. The optical transmitter of claim 10, further comprising a buffer amplifier coupled between the LDCCOMP pin of the laser driver and the bias current amplifier.

14. The optical transmitter as defined in claim 10, wherein the bias current amplifier includes a bi-polar transistor.

15. The optical transmitter of claim 14, wherein:
the bias current amplifier further includes a resistor comprising:
a first end connected to the LDCCOMP pin of the laser driver; and
a second end connected to ground; and
the bi-polar transistor comprises:
a collector portion operably connected to the LDBIAS pin of the laser driver;
a base portion operably connected to the first end of the resistor and the LDCCOMP pin of the laser driver; and
an emitter portion operably connected to ground.

16. An optical transceiver module configured for longwave optical transmission, comprising:
a transmitter optical subassembly coupled to an optical fiber and including a laser;
a receiver optical subassembly coupled to an optical fiber; and
a printed circuit board including: a consolidated laser driver/post amplifier that includes circuitry to provide a bias current and a modulation current to the laser; and
a field-effect transistor operably connected to bias loop control circuitry of the laser driver/post amplifier and configured to provide an additional bias current to the laser diode, wherein the field-effect transistor does not amplify the modulation current, and
wherein:
the circuitry of the laser driver/post amplifier that provides the bias current is voltage biased by the bias loop control circuitry of the laser driver/post amplifier;
the field-effect transistor is connected in parallel with the circuitry of the laser driver/post amplifier that provides the bias current;
a gate portion of the field-effect transistor is operably connected to the bias loop control circuitry of the laser driver/post amplifier;
a drain portion of the field-effect transistor is operably connected to an LDBIAS pin of the laser driver/post amplifier; and
a source portion of the field-effect transistor is operably connected to ground.

17. The optical transceiver module as defined in claim 16, wherein the optical transceiver module is configured as an SFP module having a data rate of at least 1 Gigabit per second.

18. The optical transceiver module as defined in claim 17, wherein the bias current and the additional bias current are provided on a common path between at least a portion of a distance between the laser driver/post amplifier and the laser.

19. The optical transceiver module as defined in claim 18, further including a buffer amplifier disposed between the bias loop control circuitry and the field-effect transistor.

20. The optical transceiver module as defined in claim 19, wherein the bias loop control circuitry regulates operation of the field-effect transistor.

21. The optical transceiver module as defined in claim 20, wherein the bias current provided by the laser driver/post amplifier includes a positive polarity bias current portion and a negative polarity bias current portion, and wherein the field effect transistor adds the additional bias current to the negative polarity bias current portion.

* * * * *